United States Patent
Pfister et al.

(10) Patent No.: US 7,233,271 B2
(45) Date of Patent: Jun. 19, 2007

(54) NOISE SHAPER CIRCUIT AND METHOD FOR REDUCING SWITCHING NOISE

(75) Inventors: Florian Pfister, Endingen (DE); Dieter Luecking, Freiburg (DE); Matthias Vierthaler, Denzlingen (DE); Carsten Noeske, Sexau (DE)

(73) Assignee: Micronas GmbH, Freiburg (DE)

( * ) Notice: Subject to any disclaimer, the term of this patent is extended or adjusted under 35 U.S.C. 154(b) by 0 days.

(21) Appl. No.: 11/202,636

(22) Filed: Aug. 11, 2005

(65) Prior Publication Data

US 2006/0044166 A1 Mar. 2, 2006

(30) Foreign Application Priority Data

Aug. 11, 2004 (DE) ...................... 10 2004 039 725

(51) Int. Cl.
*H03M 3/00* (2006.01)
(52) U.S. Cl. ..................................................... 341/143
(58) Field of Classification Search ................ 341/143, 341/144, 155, 120, 141; 375/254
See application file for complete search history.

(56) References Cited

U.S. PATENT DOCUMENTS

| | | | | |
|---|---|---|---|---|
| 3,918,042 | A * | 11/1975 | Werner | 341/143 |
| 5,157,216 | A * | 10/1992 | Chafe | 84/695 |
| 5,200,750 | A | 4/1993 | Fushiki et al. | 341/143 |
| 5,235,334 | A | 8/1993 | Manvar et al. | |
| 5,682,162 | A | 10/1997 | Hamasaki et al. | |
| 5,712,874 | A | 1/1998 | Okamoto | 375/243 |
| 5,890,059 | A * | 3/1999 | Shoemaker et al. | 455/297 |
| 5,999,347 | A | 12/1999 | Ichimura et al. | 360/32 |
| 6,137,429 | A * | 10/2000 | Chan et al. | 341/143 |
| 6,208,279 | B1* | 3/2001 | Oprescu | 341/143 |
| 6,369,731 | B1 | 4/2002 | Takeda et al. | 341/143 |
| 6,778,118 | B2* | 8/2004 | Heizmann et al. | 341/144 |
| 2004/0017854 | A1* | 1/2004 | Hansen et al. | 375/243 |

FOREIGN PATENT DOCUMENTS

JP 2003 017945 1/2003

OTHER PUBLICATIONS

Thomas H. Hansen, "Muting of Noise-Shaper Quantized Signals," pp. 77-94, May 6, 2003.

* cited by examiner

*Primary Examiner*—Peguy JeanPierre
(74) *Attorney, Agent, or Firm*—O'Shea, Getz & Kosakowski, P.C.

(57) ABSTRACT

Noise that is normally generated during the switching of a noise shaper may be reduced by switching the noise shaper to an inactive or off state after the occurrence of one or more predetermined criteria, for example the detection of a predetermined number of data values below a threshold value or equal to a certain value, or of a predetermined number of data values within a threshold region about a value that is constant with respect to the data values.

19 Claims, 4 Drawing Sheets

NOISE SHAPER CIRCUIT AND METHOD FOR REDUCING SWITCHING NOISE

PRIORITY INFORMATION

This application claims priority from German patent application DE 10 2004 039 725.2 filed Aug. 11, 2004, which is hereby incorporated by reference.

BACKGROUND OF THE INVENTION

The invention relates in general to the reduction of noise in electrical circuits, and in particular to the reduction of switching noise associated with a noise shaper that is functioning within an electrical circuit.

In the processing of data by a data processor, such as for example a digital/analog converter or a pulse width modulator, it may be advantageous to use a noise shaper to improve the signal-to-noise ratio in a desired frequency range (e.g., an audible range) with regard to any background noise that may be present. In this process, the background noise in a lower frequency range may be reduced by shifting the signal energy components to higher frequencies, which are not needed and may not be audible. The noise shaper may be used for example in systems in which amplitude quantization is carried out.

FIG. 4 illustrates a prior art circuit 10 having a noise shaper 12. A signal comprising input data of a data sequence may be provided on a line 14 to an adder 16, the resultant sum is output on a line 20 to a data processor 18. The data processed in the data processor 18 may be provided on a line 22 at an output. The data input to the data processor 18 on the line 20 may be subtracted from the data processor output on the line 22 by a subtractor 24. The result of the subtraction forms an error signal, which may be provided as an input signal on a line 26 to the noise shaper 12. The output signal from the noise shaper 12 on a line 28 may be added to or subtracted from the input data on the line 14 by the adder 16. In the case of a first-order noise filter, the error signal on the line 26 may be provided directly to the adder 16. The noise shaper 12 may typically be formed by a digital high-pass filter, which may be based on a delay arrangement or a delay line. When an error signal on the line 26 that is not equal to zero is applied to the noise shaper 12, the noise shaper 12 begins to generate an output value on the line 28, and output values may be generated as a mean value of the amplitudes of the error signal on the line 26.

FIG. 5 illustrates, as an example, a graph of the noise amplitude within the output signal on the line 22 plotted against frequency for an input data signal on the line 14 processed by the circuit 10 of FIG. 4. In the case of the circuit 10 without the noise shaper 12, relatively uniform noise amplitude over all frequencies may be obtained as illustrated by the curve 30 which represents the output signal on the line 22. On the other hand, in the case of the circuit 10 with the noise shaper 12, a noise-shaped output curve 32 is illustrated for the output signal on the line 22, whose signal to noise ratio may be improved in that there is a reduced noise amplitude in a desired range, for example in an audible range 34, together with an increased noise amplitude in a higher, non-audible frequency range. When parameters of the noise shaper 12 are changed, this may cause a corresponding change in the resulting noise spectrum.

If no input data signal is present on the line 20, the signal to noise ratio can be further improved by switching off the noise shaper 12. In particular, switching the noise shaper 12 off or to an inactive state may result in a relatively more robust output signal on the line 22, since the noise shaper 12 in this case no longer generates any noise components. FIG. 6 illustrates an example of a graph with a curve 36 of the reduced noise level of the output signal on the line 22 for the case of the noise shaper 12 being switched off, as compared to a curve 38 of an increased noise level of the output signal on the line 22 when the noise shaper 12 is switched on.

Switching off or inactivation of the noise shaper 12 of the prior art circuit 10 of FIG. 4 may lead to undesirable switching noises, also known as clicks. The switching noises may be caused by the nonlinearity of an impulse function when a signal or a sequence of data from a data sequence is switched off. This type of switching noise typically is independent of the presence or absence of a DC voltage component, thus the switching noise may also occur when the average signal at the output of the noise shaper 12 on the line 28 is zero. The switching noise may typically be due to the low-pass nature of hearing; that is when signal energy is present with a mean value of zero and then is suddenly switched to zero signal energy. This switching process briefly creates frequencies in the overall spectrum, and therefore also in the user frequency band. Thus, with traditional noise shapers 12 such as that of the circuit 10 of FIG. 4, the problem exists of switching off or inactivating the noise shaper 12 in such a way, or generating a specific structure within the noise shaper 12, so that a reduction in noise is achieved.

Most of the known techniques involve noise shapers with a single-bit output. Therefore, the transition to use of a multiple-bit noise shaper may not be possible in certain cases.

U.S. Pat. No. 5,200,750 discloses a circuit in which an additional input signal is provided to the noise shaper to stabilize the noise structure of the shaper. When the structure is stabilized, the noise shaper can be switched off. However, a relatively complex circuit arrangement and procedure are required in this case.

U.S. Pat. No. 5,712,874 discloses a circuit arrangement with a low-pass filter for a first integrator of the noise shaper, to automatically stabilize the noise signal or data sequence of the shaper. An implementation for a multiple-bit noise shaper may not be possible in this case. Further, switching of the low-pass filter may produce a switching noise with an amplitude that is relatively greater than the original switching noise amplitude.

According to a thesis by Thomas H. Hansen, entitled "*Muting of Noise-Shaper Quantized Signals*", page 77–94, May 6, 2003, a noise shaper may be halted on the basis of a prediction of the anticipated specific energy. The thesis proposes a method for reducing unwanted in-band transients upon halting of a noise shaper signal. In this method, a detector may be used as a switching mechanism for controlling the instant at which the quantized signal will be set at zero. The switching device for halting the noise shaper may use a model of the noise shaper, on which basis a prediction may be made for the time to switch the noise shaper off.

What is needed is an improved method and device for reducing noise during the switching of a noise shaper.

SUMMARY OF THE INVENTION

Noise that is normally generated during the switching of a noise shaper is reduced by switching the noise shaper to an inactive or off state after the occurrence of one or more predetermined criteria, for example the detection of a predetermined number of data values below a threshold value or equal to a certain value, or of a predetermined number of data values within a threshold region about a value that is constant with respect to the data values.

A circuit that includes the noise shaper can be configured from a plurality of individual components or in an integrated circuit.

As used herein, the term "switching" means a general process that involves, depending on the configuration, an active mechanical or electrical switching or a logical switching or deactivation of the noise shaper or of the corresponding process steps of a noise shaper.

The various predetermined criteria may be independent of each other, or they may be combined or expanded by one or more switching criteria. For example, one switching criterion may be that the data values be equal to or below a threshold value. A second switching criterion may be that the data values lie within a threshold region about a value that is constant with respect to a sequence of data values, so that a switching process can also occur with a sequence of constant or essentially constant data values. Such a case may occur, for example, when a mono-frequency interfering noise is superimposed on the input data, so that these data values, in the case of absent useful data values that would not be equal to a constant data value, nevertheless remain at a relatively high constant value.

Furthermore, by a sequence of data values and by a predetermined number of data values to be detected may mean that not all of the individual data values within the sequence of data values are subject to the switching criterion each time, so that even in the case of, for example, individual outlying data values the switching criterion can still be fulfilled. Also, data values may be used to satisfy the switching criterion that can be detected at various points of the overall switching arrangement.

In an embodiment of a method for reducing noise during the switching of a noise shaper to an off or inactive state, input data present at one input of a data processor may be changed by the noise shaper. The noise shaper may at times be switched off or inactive. The switching off or inactivation, and where for the reduction of the switching noise the switching may be performed after the detection of a predetermined number of data values equal to or below the threshold value. In an alternative embodiment of a method, data present at an input of a data processor may be changed by the noise shaper. The noise shaper may at times be switched off or inactive. To reduce the switching noise the switching may be performed after detecting a predetermined number of data values which lie within a threshold region about a value (e.g., a constant value) relative to a sequence of data values.

In an embodiment of a circuit that reduces noise during the switching of a noise shaper that is part of the circuit to an inactive or off state, the noise shaper may change input data values of a data sequence provided to a data processor. A switching device may be used to inactivate the noise shaper according to one or more predetermined criteria. The switching device may have a counter for counting data values equal to or below a threshold value. The switching device may switch the noise shaper off after detecting a predetermined number of counted data values equal to or below the threshold value. In an alternative embodiment, the switching device may have a counter for counting data values within a threshold region about a value (e.g., a constant value) relative to data values adjacent to each other and the switching device may switch off the noise shaper after detecting a predetermined number of counted data values within the threshold region.

The predetermined number may be variably assigned, for example, the number may be assigned depending on the nature or origin of the data values and/or the fluctuation range of the values of the consecutive data. This may correspond to a noise shaper in which the switching device may variably assign the predetermined number, for example, depending on the nature or origin of the data values and/or depending on the fluctuation range of the values of consecutive data.

A separate signal for the inactivation may be provided to the noise shaper before the switching or in place of an active switching for a predetermined number of data values. This may correspond to a noise shaper in which the noise shaper has an input for receiving a separate signal for switching off or inactivation during a predetermined duration or number of data values prior to the switching.

Preprocessed input data values may be provided to the noise shaper prior to the switching or in place of an active switching, where the preprocessing may be performed to gradually reduce the data amplitude over the course of a predetermined number of data values. The noise shaper may receive preprocessed data values prior to the switching, where the preprocessed input data values may be provided to gradually reduce the data amplitude over the course of a predetermined number of data values. This may enable an extraction in the event that the data values detected are not equal to a constant data value or may lie above an undesirable value for the switching. Thus, after the detection of a predetermined number of data values fulfilling the switching criterion, and before the actual switching off or inactivation of the noise shaper, a reduction of the data values and/or the variables or values generated in the noise shaper may be performed for an additional sequence of data values or an additional period of time.

After detecting a predetermined number of data values at the input of the noise shaper equal to or less than a threshold value, a detection of output values may be started and the switching off and/or a resetting of the noise shaper may be performed after the detection of a predetermined number of data values equal to or less than a threshold value at the output of the noise shaper. In particular, resetting of the noise shaper may be performed to a zero value or to a non-zero value, such as for example 0.5.

The detected data values may be input data values for the data processor that may be either changed or unchanged by the noise shaper. As an alternative or in combination, the detected data values may be output data values of the data processor. Also, the detected data values may be input data values at the input of the noise shaper. In such a case, the detected data values may be formed from input data values and output data values of the data processor.

The method and device may be utilized in conjunction with a data processor that may comprise a digital/analog converter or a pulse width modulator.

The number of detected data values may be reduced in a cascade manner when the noise shaper has not been reset or switched for a particular length of time.

It may be presumed that the energy of a switching noise may become less if the data values output by the noise shaper have already been zero, near zero, or near a constant value for a particular length of time or for a predetermined sequence of data values, before the switching process is carried out. Thus, an advantageous time for the switching process may be determined. Since the noise shaper outputs data with zero values during intervals of time, such as a pause in the musical titles of a compact disk, and the input data of the layout or the output data of the processing devices also output zero values for a length of time, this has an effect on the energy contained in the pulses that are generated in the entire spectrum during the switching process.

These and other objects, features and advantages of the present invention will become more apparent in light of the following detailed description of preferred embodiments thereof, as illustrated in the accompanying drawings.

DETAILED DESCRIPTION OF THE INVENTION

Figure 1:
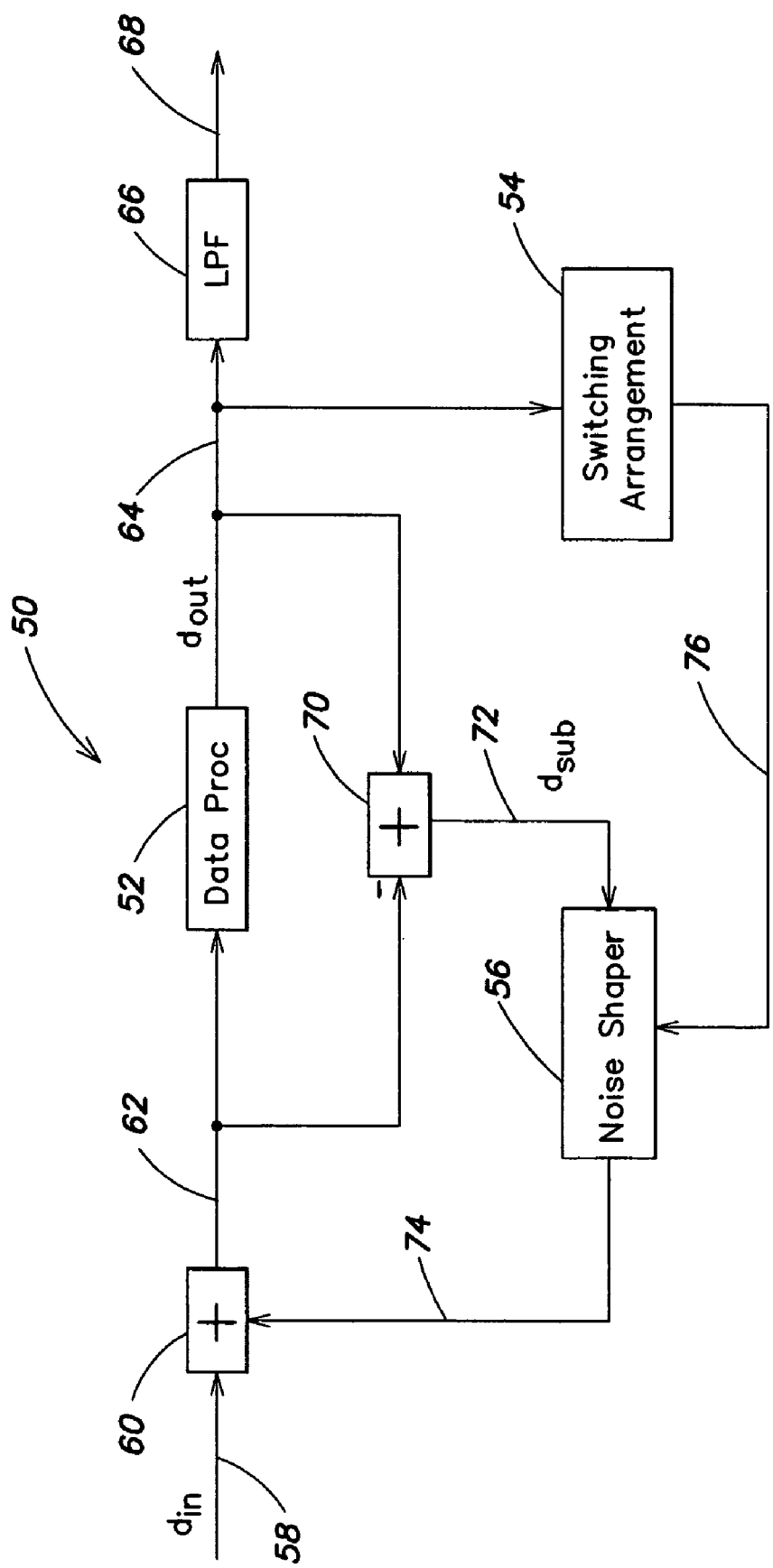
FIG. 1 is a block diagram of a noise shaper circuit.

Referring to FIG. 1, a circuit 50 may include a data processor 52 and a switching device 54 for switching a noise shaper 56. The components of the circuit 50 of FIG. 1 may be embodied individually or in one or more integrated circuits.

Input data $d_{in}$ of a signal data sequence on a line 58 may be provided to an adder 60. The output of the adder 60 on a line 62 may be provided to the data processor 52. The input data $d_{in}$, together with a value either added to or subtracted therefrom in the adder 60, may be processed in the data processor 52 which may comprise, for example, a digital-to-analog converter or a pulse width modulator. For example, the data processor 50 may convert a 16-bit signal on the line 62 to a 5-bit signal output on a line 64. The output data $d_{out}$ of the data processor 52 on the line 64 may be provided directly to an output of the circuit 50 or, as illustrated, through one or more additional devices 66 to provide an output on a line 68. The additional processing device 66 for example may be a low-pass filter that may be used to determine an amplitude of a switching noise to test the effects of the overall circuit layout on switching noises.

The output data $d_{out}$ on the line 64 may be provided to a subtractor 70, which subtracts the data 60 on the line 62 from the output data $d_{out}$ on the line 64. The output $d_{sub}$ of the subtractor 70 on a line 72 may input to the noise shaper 56. The noise shaper 56 may comprise a high-pass filter with an arrangement of delay elements. The output signal of the noise shaper 56 may be provided on a line 74 to the adder 60 where it may be added to the input data $d_{in}$ on the line 58.

The switching device 54 may comprise a counter and a memory for saving the count values and certain preset variables. The switching device 54 may generate a switch signal on a line 76 for resetting the noise shaper 56 and/or for switching the noise shaper 56 to an inactive or off state when, for example, no input data $d_{in}$ for processing have been entered into the circuit 50 or are being processed therein. In the alternative, the noise shaper input data $d_{sub}$ on the line 72 may also be provided to the switching device 54 for processing thereby. For example, resetting of the noise shaper 56, in particular the high-pass filter therein, may occur in particular by resetting the memory in the switching device 54 at the same time.

An input of the switching device 54 may be connected by the line 64 to a data relaying point of the circuit 50. The data relaying point may depend on which of the data within the circuits are to be used as the basis for a switching criterion. In the embodiment of FIG. 1, the data utilized as the basis for the switching criterion may be the output data $d_{out}$ of the data processor on the line 64.

Figure 2:
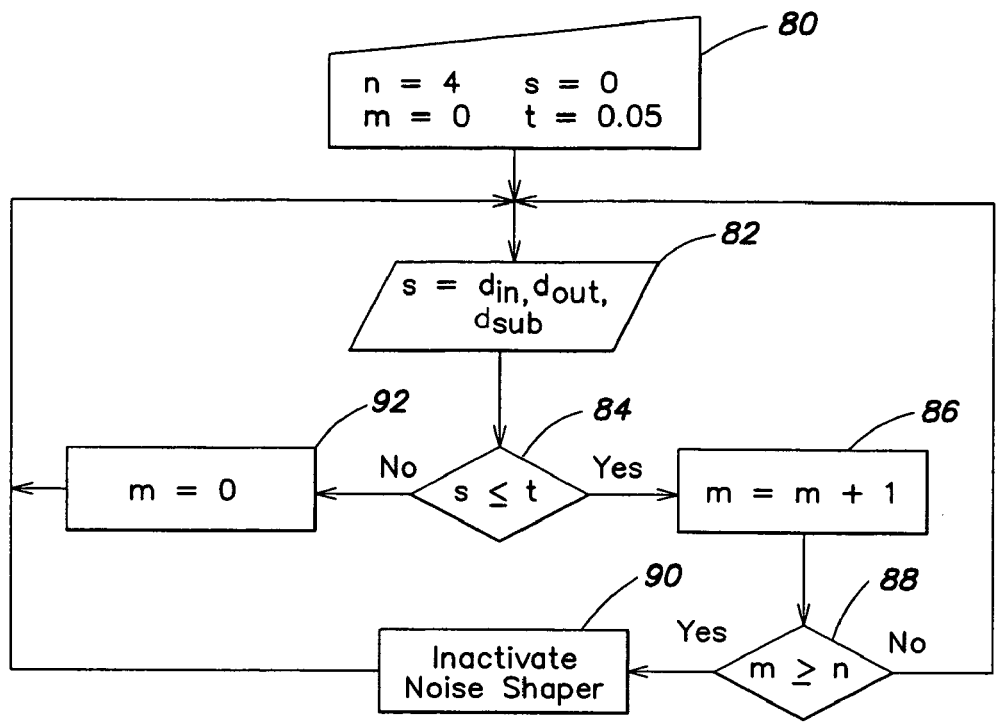
FIG. 2 is a flowchart of a method for switching a noise shaper to an inactive or off state.
Figure 4:
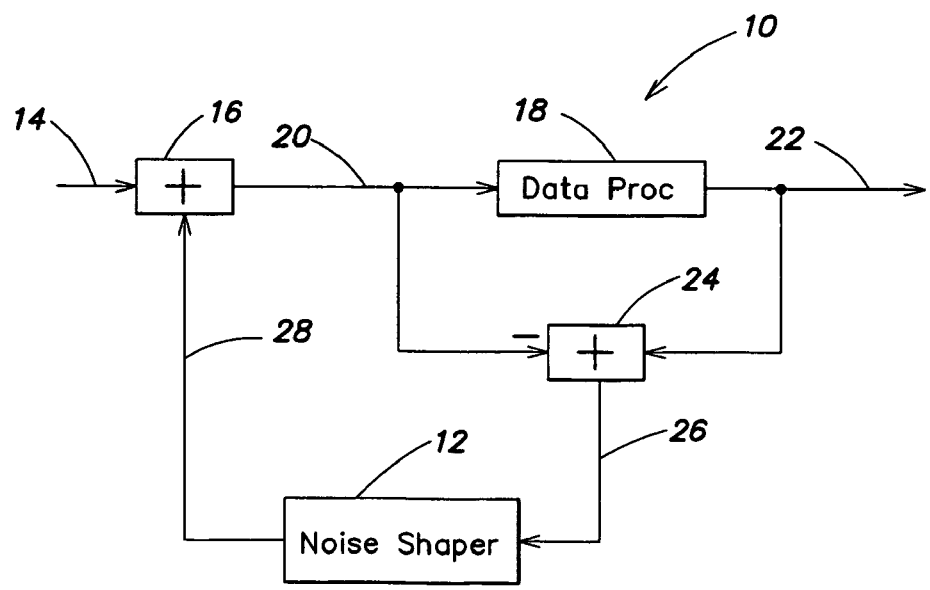
FIG. 4 is a block diagram of a prior art noise shaper circuit.

In a method illustrated in the flowchart of FIG. 2, in a first step 80 a number of variables n, m, s, t may have predetermined values assigned to them. These variables may be stored for example in the memory of the switching device 54. Next, in an input step 82, a variable s is assigned the value of the data point currently being detected or taken into account, for example, $d_{in}$, $d_{out}$ and/or $d_{sub}$. In a following comparison step 84, a check may be performed whether the value of the data variable s is less than or equal to the predetermined value of the threshold variable t. The threshold value t can be chosen such that, during the allocation of the variables in the step 80, the threshold value t may be a constant or a variable, depending for example on the operating circumstances. If the value of the data variable s is less than or equal to the threshold value t, a running index m originally set at zero in the step 80 may be incremented by one in a step 86. In a following comparison step 88, a check may be made whether the value of the running index m, is greater than or equal to a predetermined number n of the data being detected. Thus, the running index m corresponds to a count value of the counter. If the running index m is less than the predetermined number n, there may be a return to the input step 82 to enter a next value of the data being detected (e.g., $d_{in}$, $d_{out}$, $d_{sub}$). If, instead, the running index m is greater than or equal to the predetermined number n, the noise shaper may be switched off, reset, or placed in an inactive state in a step 90. This may occur, for example, by generating the switch signal on the line 76 (FIG. 1). The method then returns to the input step 82. If it is determined in the comparison step 84 that the value of the data variable s is greater than the threshold value t, the running index m may be set at zero, i.e., the counter may be reset in a step 92.

The method thus checks to see whether a sequence of a number of consecutive data points ($d_{in}$, $d_{out}$, $d_{sub}$) is less than or equal to the threshold value t. If so, the noise shaper 56 (FIG. 1) may be inactivated or switched off. Increasingly larger predetermined numbers n may be able to achieve an increasingly greater reduction of the switching noise upon inactivation or resetting of the noise shaper 56. Therefore, depending on the required or desired reduction in the switching noise, the predetermined number n may be assigned according to the application purpose and need. In particular, a variable assigning of the predetermined number n may be possible, so as to be able to adapt to changed operating conditions. The threshold value t can either be a constant or be variably adapted, the latter in order to be able to adapt to changed operating conditions or immediate requirements. In particular, the threshold value t may also be set to zero, and the determination of a suitable threshold value will depend on the conditions of the moment.

In an alternative embodiment, a sequence of consecutive data values may be considered as to whether they contain one or more outlying data values that individually exceed the threshold value t. To prevent an undesired immediate reactivation of the noise shaper 56 (FIG. 1), a certain number of individual outlying data values may be allowed that can exceed the threshold value t within a sequence of data before reactivation occurs.

Figure 3:
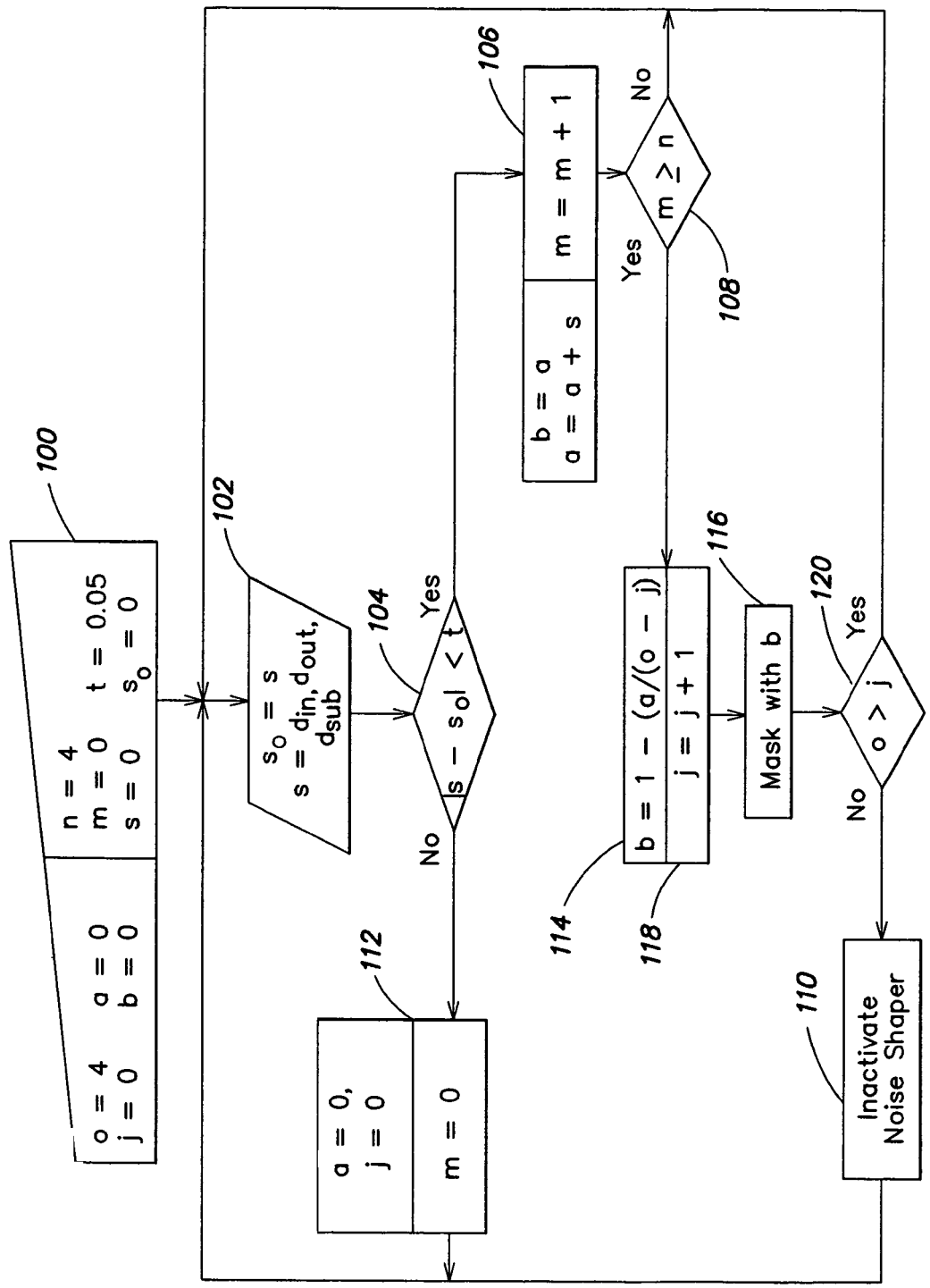
FIG. 3 is a flowchart of an alternative method for switching a noise shaper to an inactive or off state.
Figure 5:
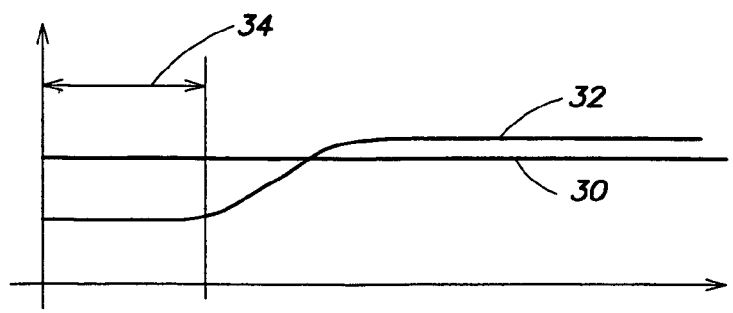
FIGS. 5–7 are graphs that illustrate various noise signals within the prior art noise shaper circuit of FIG. 4.
Figure 6:
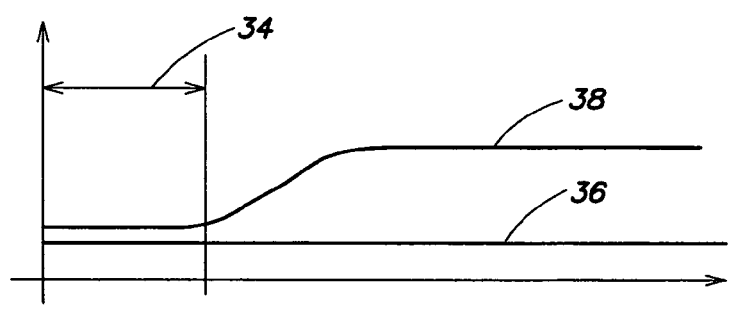
Figure 7:
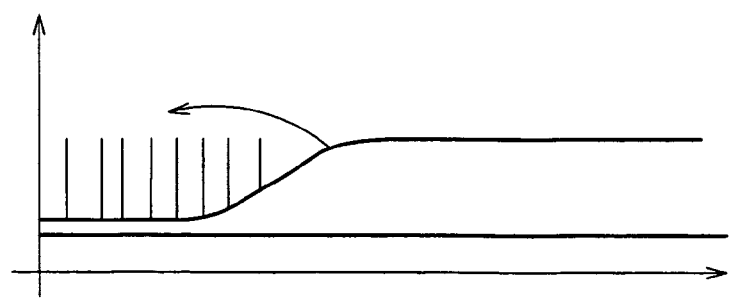

In an alternative method illustrated in the flowchart of FIG. 3, the switching of the noise shaper 56 (FIG. 1) to the inactive or off state may occur when a sequence of n number of data points ($d_{in}$, $d_{out}$, $d_{sub}$) corresponds to a constant value or lies about a constant value within a threshold region. The threshold value t, accordingly, may indicate the limit for the threshold region.

In a first step 100, an allocation of the variables n, m, t, s, so may be performed. In step 102 the detected data ($d_{in}$, $d_{out}$, $d_{sub}$) may be entered and assigned to the data variable s. A prior value of the data variable s may be saved in a data variable $s_o$. In step 104, a difference may be formed between the values of the data variables s and $s_o$ and the absolute magnitude of the difference may be compared to the threshold value t. If the difference is less than the threshold value t, the running index m may be incremented by one in step 106. In step 108 a check may be performed as to whether the running index m is less than or equal to the predetermined number n. If not, there is a return to the input step 102. If yes, a resetting of the noise shaper 56 (FIG. 1) may be performed in step 110, for example a switching off or inactivating of the noise shaper 56 by presenting the switch signal on the line 76 (FIG. 1). After this, there may be a return to the input step 102. If the step 104 determines that the difference is equal to or greater than the threshold value t, the running index m and the data variables s and so may be reset in a step 112.

In an alternative embodiment of the method illustrated in the flowchart of FIG. 3, certain ones of the data values may be masked. The masking may be used, for example, when constant data values are present or when data values may be too high for inactivation of the noise shaper 56. These values may be reduced gradually by a number of reductions, o, of consecutive data points ($d_{in}$, $d_{out}$, $d_{sub}$) to a value that enables inactivation of the noise shaper with sufficiently low residual switching noise. For example, in step 106 in addition to increasing the running index m an auxiliary data variable a may be increased by the current value of the data variable s. After determining that the running index m, is greater than or equal to the predetermined number n in step 108, a sequence of additional data processing steps may be performed prior to step 110 of resetting the noise shaper 56. For example, in step 114, an additional reduction variable b, as a reduction factor, may equal a value of one minus the value of the auxiliary data variable a divided by the reduction number o of masking steps minus a number of masking steps performed j. The reduction variable b may be multiplied in a step 116 with the current data value or with another value being masked. Furthermore, a masking running index for the number of masking steps performed j may be incremented by one in step 118 prior to step 116. The masking running index j may be checked in step 120 to determine if it is less than or equal to the reduction number o, i.e., the duration of the masking. If so, there is a return to the input step 102. If not, then the noise shaper 56 is inactivated in step 110. If in step 104 it is determined that the difference is greater than or equal to the threshold value t, there may also be a resetting of the auxiliary data variable a and the masking running index j in step 112.

The circuit illustrated in FIG. 1 and the methods illustrated in the flowcharts FIGS. 2 and 3 may continuously count the number of contiguous zeroes at the output of the noise shaper 56. If a sampled value or data value is zero, the counter may be reset and may start counting again. A particular number n of zeroes detected per unit at the output the switch signal 76 provided to the noise shaper 56 thereupon may erase all the delay elements of the noise shaper at the same time. Since the input data $d_{in}$ and the output data $d_{out}$ at this time may already be zero, the noise shaper 56 may remain empty until a value of the input data $d_{in}$ not equal to zero may again be provided by the data processor 52. As soon as a data value from the data $d_{in}$ may be detected with a value greater than zero, its corresponding presentation at the noise shaper 56 automatically frees up the output again and moreover erases the counter, so that the process starts all over. The noise shaper 56 may be reset once the data input has been constant for a particular number of data values. Advantageously, the switching criterion may be whether the output data values $d_{out}$ may be equal to zero or less than a threshold value t. It may be advantageous to switch the circuit 50 with the noise shaper 56 for example by using a constant input signal in the noise shaper 56 for a particular length of time or number of consecutive data values. Advantageously, the predetermined number of data used as the switching criterion can be adjusted variably.

As described herein, the noise shaper may be switched off or inactivated with reduced switching noise. This may be accomplished without a specific turn-off command, which would analyze the input signal on the line 72 to the noise shaper 56 and then may activate the detection of zero values at very low signal levels. The zero detection itself may switch the noise shaper 56 on and off, when a particular number of zero values or corresponding values below a threshold value may be detected at the output. Furthermore, a particular number of zeroes may be assigned to a particular signal amplitude, which helps to achieve a relatively small input signal after a particular number of detected zero values.

To assist the noise shaper in switching off, the number of zeroes needed for the resetting can be cascaded. For example, when starting with 64 zeroes, if the noise shaper has not been reset for a certain length of time, the number can be reduced to the detection of 32 zeroes as the switching criterion. If, after another particular time period 32 zeroes are not detected, then the detection may be converted to 16 zeroes, and so forth.

Although the present invention has been shown and described with respect to several preferred embodiments thereof, various changes, omissions and additions to the form and detail thereof, may be made therein, without departing from the spirit and scope of the invention.

What is claimed is:

1. A method for reducing switching noise that occurs during switching of a noise shaper, comprising the steps of:
   detecting a plurality of data values;
   comparing each of the plurality of data values to predetermined value criterion and incrementing a counter that provides a count value each time the predetermined value criterion is met; and
   switching the noise shaper to an inactive state when the count value exceeds a count threshold value.

2. The method of claim 1, where the predetermined value criterion comprises the current data value being less than a limit value.

3. The method of claim 1, where the predetermined value criterion comprises the current data value being greater than limit value.

4. The method of claim 1, where the predetermined value criterion comprises the current data value being within a fixed amount from a comparison value.

5. The method of claim 1, further comprising the step of modifying the data values provided to an input of a data processor as a function of the noise shaper being switched to an inactive state.

6. The method of claim 1, further comprising providing processed input data to the noise shaper, the noise shaper being responsive to the processed input data to reduce an amplitude of the data values at an output of the noise shaper.

7. A circuit, comprising:
- a noise shaper that receives and processes input signals and provides a noise shaper output signal; and
- a switching device that detects a plurality of data values, compares each of the plurality of data values to predetermined value criterion and increments a counter value each consecutive time the current data value satisfies the predetermined value criterion, and switches the noise shaper to an inactive state when the count value exceeds a threshold value.

8. The circuit of claim 7, where the predetermined value criterion comprises the current data value being less than a limit value.

9. The circuit of claim 7, where the predetermined value criterion comprises the current data value being greater than a limit value.

10. The circuit of claim 7, where the predetermined value criterion comprises the current data value being within a fixed amount from a comparison value.

11. The circuit of claim 7, where the noise shaper comprises a high pass filter.

12. The circuit of claim 7, further comprising a counter that counts the number of data values that meet the predetermined value criterion and provides the count signal indicative thereof.

13. The circuit of claim 7, where the noise shaper and the switching device are arranged in an integrated circuit.

14. The circuit of claim 7, further comprising a data processor that receives a plurality of data values, processes the data values, and provides corresponding processed data values, where the processed data values are provided to the noise shaper.

15. The circuit of claim 7, where the switching device variably assigns the predetermined number of data values depending on a range of variation of the data values of consecutively occurring data.

16. The circuit of claim 7, where the noise shaper receives a separate signal from the switching device for inactivation of the noise shaper after a predetermined number of the data values have been detected by the switching device.

17. The circuit of claim 7, where the noise shaper receives processed data values, where the processed data values reduce in amplitude over the course of a predetermined number of the data values.

18. The circuit of claim 7, where the detected data comprise input data for the data processor that have been processed by the noise shaper.

19. The circuit of claim 7, where the detected data comprise output data from the data processor.

* * * * *